(12) United States Patent
Bratkovski et al.

(10) Patent No.: US 8,283,649 B2
(45) Date of Patent: Oct. 9, 2012

(54) MEMRISTOR WITH A NON-PLANAR SUBSTRATE

(75) Inventors: Alexandre M. Bratkovski, Mountain View, CA (US); Shih Yuan Wang, Palo Alto, CA (US); Jianhua Yang, Palo Alto, CA (US); Michael Stuke, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 492 days.

(21) Appl. No.: 12/510,753

(22) Filed: Jul. 28, 2009

(65) Prior Publication Data

US 2011/0024710 A1    Feb. 3, 2011

(51) Int. Cl.
*H01L 29/04* (2006.01)
(52) U.S. Cl. .................. 257/3; 257/E45.003; 438/381
(58) Field of Classification Search .................. 257/2–5, 257/43, 528, 536, 537, 623, E45.002, E45.003, 257/E21.004; 438/104, 381, 382
See application file for complete search history.

(56) References Cited

U.S. PATENT DOCUMENTS

| | | | | |
|---|---|---|---|---|
| 5,687,112 A * | 11/1997 | Ovshinsky | ................. | 365/163 |
| 6,087,674 A * | 7/2000 | Ovshinsky et al. | ............... | 257/2 |
| 6,507,061 B1 * | 1/2003 | Hudgens et al. | .............. | 257/295 |
| 6,512,241 B1 * | 1/2003 | Lai | .................................. | 257/4 |
| 6,670,628 B2 * | 12/2003 | Lee et al. | ......................... | 257/4 |
| 6,870,751 B2 * | 3/2005 | Van Brocklin et al. | ......... | 365/96 |
| 7,208,372 B2 * | 4/2007 | Hsu et al. | ..................... | 438/257 |
| 7,897,955 B2 * | 3/2011 | Jin et al. | ............................ | 257/2 |
| 2005/0180189 A1 * | 8/2005 | Happ et al. | .................... | 365/145 |
| 2008/0079029 A1 * | 4/2008 | Williams | ..................... | 257/213 |
| 2008/0090337 A1 | 4/2008 | Williams | | |
| 2008/0206931 A1 * | 8/2008 | Breuil et al. | .................. | 438/128 |
| 2011/0227030 A1 * | 9/2011 | Pickett et al. | ..................... | 257/4 |

OTHER PUBLICATIONS

Yoo et al., "Site-Specific Magnetic Assembly of Nanowires for Sensor Arrays Fabrication", IEEE Transactions on Nanotechnology, vol. 7 Issue 3 pp. 251-255.

* cited by examiner

*Primary Examiner* — Matthew Landau
*Assistant Examiner* — Joseph C Nicely (57) ABSTRACT

A memristor includes a substrate having a plurality of protrusions, wherein each of the plurality of protrusions extends in a first direction, a first electrode provided over at least one of the plurality of protrusions, wherein the first electrode conforms to the shape of the at least one protrusion such that the first electrode has a crest, a switching material positioned upon the first electrode; and a second electrode positioned upon the switching material such that a portion of the second electrode is substantially in line with the crest of the first electrode along the first direction, wherein an active region in the switching material is operable to be formed between the crest of the first electrode and the portion of the second electrode that is substantially in line with the crest of the first electrode.

20 Claims, 6 Drawing Sheets

MEMRISTOR WITH A NON-PLANAR SUBSTRATE

CROSS-REFERENCE TO RELATED APPLICATIONS

The present application has the same Assignee and shares some common subject matter with U.S. Patent Application Publication No. 20080090337, filed on Oct. 3, 2006, by R. Stanley Williams, entitled "Electrically Actuated Switch"; PCT Patent Application No. PCT/US09/30827, entitled "Memristor Having a Triangular Shaped Electrode", filed on Jan. 13, 2009; and U.S. patent application Ser. No. 12/510, 589, entitled "Memristor Having a Nanostructure in the Switching Material", filed on even date herewith, now U.S. Pat. No. 8,207,593, issued Jun. 26, 2012. The disclosures of the foregoing references are hereby incorporated by reference in their entireties.

BACKGROUND

Solid state memristive devices rely on the drift of mobile charge dopants upon the application of an electrical field, as discussed in the Patent Publication 20080090337. These types of devices have been found to have promising properties in the fields of both digital and analog non-volatile electronic logic. To illustrate the increase potential of analog non-volatile electronic logic, synaptic computing has emerged as a potential technology that is enabled by the relatively small size, low cost, and low power consumption provided by solid state memristive devices.

Researchers have designed nano-scale reversible switches with an ON-to-OFF conductance ratio up to $10^4$. Crossbar circuitry is often constructed using these types of switches. A useful configuration of this crossbar circuitry is a latch, which is an important component for constructing logic circuits and communicating between logic and memory. Researchers have described logic families entirely constructed from crossbar arrays of switches, as well as hybrid structures using switches and transistors. The devices that are presently fabricated have room for improvement particularly in terms of cyclability.

BRIEF DESCRIPTION OF THE DRAWINGS

Embodiments are illustrated by way of example and not limited in the following figure(s), in which like numerals indicate like elements, in which.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein is a memristor formed of a pair of spaced apart electrodes with a switching material positioned between the electrodes. In addition, at least one electrode of the pair of spaced apart electrodes has a crest (which may also be considered as an embossing or a protrusion) or a trough extending into the switching material, which improves an electrical field between the electrodes and thus the performance of the memristor. More particularly, the crest or trough disclosed herein enables the drift of mobile charge dopants to be more focalized as compared with conventional memristive devices, which results in improved performance of the memristor by substantially reducing edge breakdown of the active region formed between the electrodes.

As discussed in greater detail herein below, the crest and/or trough is formed in one or both of the electrodes through conformance with non-planar surfaces in either or both of a substrate and the switching material upon which the electrodes are provided. The crest and/or trough disclosed herein are typically smaller than 50 nanometers. In addition, one or more field concentration elements 302 may be provided on one or both of the electrodes to further reduce edge breakdown of the active region.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch is able to change its state only once via an irreversible process such as an oxidation or reduction reaction; such a switch may be the basis of a programmable read only memory (PROM), for example.

The term "reconfigurable" means that a switch can change its state multiple times via a reversible process such as an oxidation or reduction; in other words, the switch may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.04 to 10 micrometers, heights that can range from a few nanometers to a micrometer, and lengths of several micrometers and longer.

A memristor is a two-terminal device in which the magnetic flux between the terminals is a function of the amount of electric charge that has passed through the device.

A crossbar is an array of switches, here memristors, that can connect each wire in one set of parallel wires to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns.

Figure 1A:
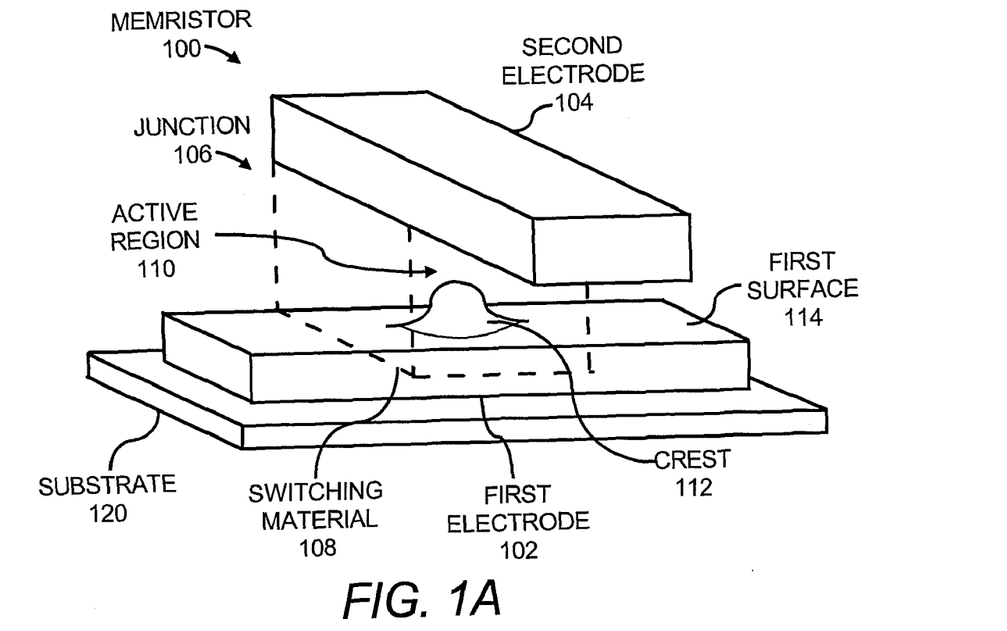
FIG. 1A illustrates a perspective view of a memristor, according to an embodiment of the invention.

With reference first to FIG. 1A, there is shown a perspective view of a memristor 100, according to an embodiment. It should be understood that the memristor 100 depicted in FIG. 1A may include additional components and that some of the components described herein may be removed and/or modified without departing from a scope of the memristor 100. It should also be understood that the components depicted in FIG. 1A are not drawn to scale and thus, the components may have different relative sizes with respect to each other than as shown therein.

Generally speaking, the memristor 100 depicted in FIG. 1A may be built at the micro- or nano-scale and used as a component in a wide variety of electronic circuits. For instance, the memristor 100 may be used as the basis for memories, switches, and logic circuits and functions. When used as a basis for memories, the memristor 100 may be used to store a bit of information, 1 or 0. When used as a switch, the memristor 100 may either be a closed or open switch in a cross-point memory. When used as a logic circuit, the memristor 100 may be employed as bits in a logic circuit that resembles a Field Programmable Gate Array, or as the basis for a wired-logic Programmable Logic Array. The memristor 100 disclosed herein is also configured to find uses in a wide variety of other applications.

As depicted in FIG. 1A, the memristor 100 includes a first electrode 102 positioned below a second electrode 104. In addition, the first electrode 102 is in a crossed arrangement with respect to the second electrode 104, such that the first electrode 102 is arranged substantially perpendicularly to the second electrode 104. One or both of the first electrode 102 and the second electrode 104 may be formed of metal or semiconductor materials. By way of particular example, both of the first electrode 102 and the second electrode 104 are formed of, for instance, platinum, gold, titanium, silver, or the like. As another particular example, both the first electrode 102 and the second electrode 104 are formed of doped silicon.

A switch junction 106 is depicted as connecting the first electrode 102 to the second electrode 104. The switch junction 106 is composed of a switching material 108, which may include, for instance, titanium dioxide ($TiO_2$) or other oxide species, such as nickel oxide or zinc oxide, etc. In one regard, the switching material 108 is configured to have a conductive channel (active region 110) formed into the switching material 108 by a localized field-driven atomic modification, as discussed in greater detail herein below. In another embodiment, the switching material 108 is formed of any suitable material that is formed of molecules having a switchable segment or moiety that is relatively energetically stable in two different states.

Although the switching material 108 has been depicted as having a similar size as the first and second electrodes 102, 104, it should be understand that the switching material 108 may extend substantially outside of the junction 106 and may extend to junctions between other first and second electrodes (not shown).

The first electrode 102 is depicted as being positioned on the substrate 120 and having a crest 112 that extends above a first surface 114 of the first electrode 102 and into the switching material 108 in the junction 106. As described in greater detail herein below, the substrate 120 includes a protrusion (not shown) that extends in a first direction towards the second electrode 104. In addition, the crest 112 may conform substantially to the shape of the protrusion. The protrusion 122 may be sized to cause the crest 112 in the first electrode 102 to have a height and/or width of between about several nanometers to several tens of nanometers. By way of particular example, the crest 112 may have a height and/or width of between about 3-10 nanometers. As another example, the crest 112 may have a height and/or width of between about 3-50 nanometers.

Figure 1B:
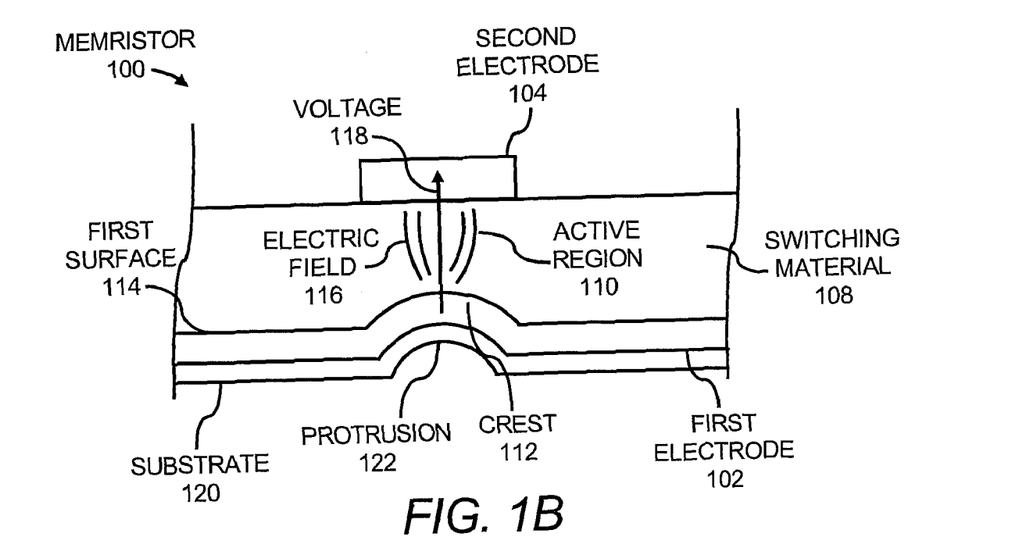
FIG. 1B illustrates a cross-sectional front view of the memristor depicted in FIG. 1A, according to an embodiment of the invention.

With reference now to FIG. 1B, there is shown a cross-sectional front view of the memristor 100 depicted in FIG. 1A, according to an embodiment. As shown in FIG. 1B, an electric field 116 at the active region 110 of the switching material 108 is created when a voltage 118 is applied across the first electrode 102, the crest 112 and the second electrode 104, as denoted by an arrow. Although the voltage 118 is depicted as originating from the first electrode 102, it should be understood that the voltage 118 may instead originate from the second electrode 104 without departing from a scope of the memristor 100.

Field lines of the electric field 116 illustrate the intensity of the field between the first electrode 102 and the second electrode 104 when a voltage 118 is applied across the electrodes. Initially the entire switching material 108 is nonconductive. As such, a forming process is required to form a conductive channel in the switching material 108 between the first electrode 102 and the second electrode 104. The forming process includes applying a sufficiently high (threshold) voltage across the first electrode 102 and the second electrode 104 for a sufficient length of time to cause the conductive channel (active region 110) in the switching material 108 to form. The threshold voltage and the length of time required for the forming process may depend upon the type and the thickness of material used for the switching material 108, the first electrode 102 and the second electrode 104.

The conductive channel formed from the forming process is referred to herein as the active region 110 of the memristor 100. In addition, the conductivity of the active region 110 may be modulated by applying different biases across the first electrode 102 and the second electrode 104. Thus, the memristor 100 may be reconfigurable based upon the bias applied across the first electrode 102 and the second electrode 104. In other instances, the memristor 100 may include a switching material 108 that is singly configurable.

As shown in FIG. 1B, the crest 112 generally localizes the formation of the conductive channel (active region 110) in the switching material 108 during the forming step. More particularly, the relatively shorter distance between the top of the crest 112 and the bottom of the second electrode 104 as compared with the first surface 114 and the bottom of the second electrode 104 creates a local field enhancement effect above the crest 112.

As such, the electric field 116 at the top of the crest 112 is much higher than if the same bias was applied across the flat portions of the first surface 114. In addition to concentrating the electric field 116 during the electroforming step, the crest 112 will also localize the electrochemical reaction that occurs between the first electrode 102 and the switching material 108 and will also localize the mechanical stress during deposition of the switching material 108, all of which may assist in localizing the electroforming of the conductive channel in the switching material 108 at the desired location in the memristor 100.

In a conventional memristor having electrodes with relatively flat profiles, the conductive channel formed during a forming step may occur at any point along the junction of crossed electrodes, and most likely at the relatively sharp angled walls of the electrodes. The location of an active region prior to the forming process in a conventional memristor is thus difficult to predict and thus the conventional memristors require that the memristors be spaced with a sufficient margin of error to prevent cross talk between the memristors. In addition, the random nature of electroforming in the traditional devices causes a huge variance from device to device and from switching cycle to cycle. In the memristor 100, the conduction channel localization afforded by the crest 112 improves the predictability and reproducibility of the spatial location of the active region 110. The memristor 100 disclosed herein is thus able to be spaced more closely together with other memristors 100 with reduced risk of cross talk as compared with the conventional memristors. The variance from device to device can be significantly reduced.

Figure 2A:
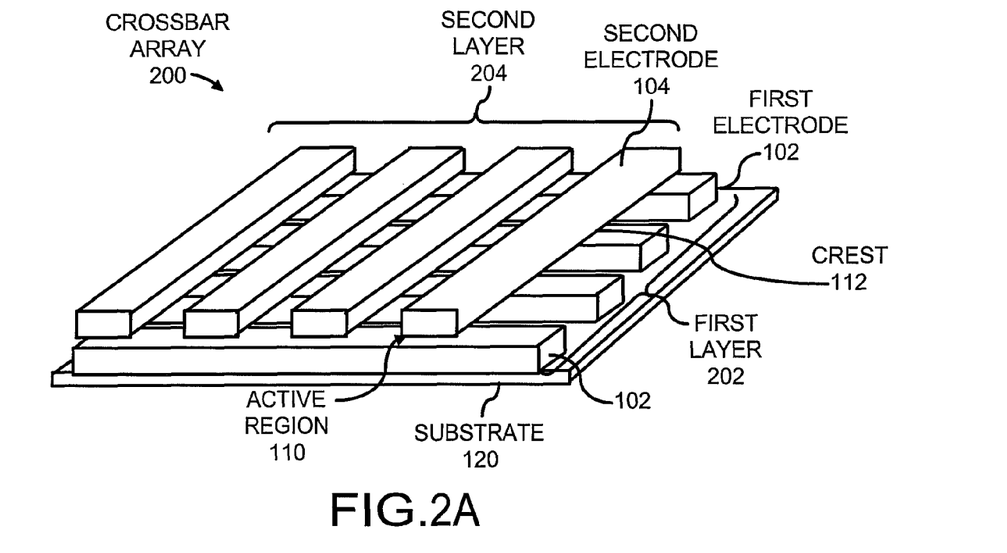
FIG. 2A illustrates a perspective view of a crossbar array employing a plurality of the memristors depicted in FIG. 1A, according to an embodiment of the invention.

With reference now to FIG. 2A, there is shown a perspective view of a crossbar array 200 employing a plurality of the memristors 100 shown in FIG. 1A, according to an embodiment. It should be understood that the crossbar array 200 depicted in FIG. 2A may include additional components and that some of the components described herein may be removed and/or modified without departing from a scope of the crossbar array 200.

As shown in FIG. 2A, a first layer 202 of approximately parallel first electrodes 102 is overlain by a second layer 204 of approximately parallel second electrodes 104. The second layer 204 is roughly perpendicular, in orientation, to the first electrodes 102 of the first layer 202, although the orientation angle between the layers may vary. The two layers 202, 204 form a lattice, or crossbar, with each second electrode 104 of the second layer 204 overlying all of the first electrodes 102 of the first layer 202 and coming into close contact with each first electrode 102 of the first layer 202 at respective junctions 106, which represent the closest contact between two of the first and second electrodes 102 and 104. The crossbar array 200 may be fabricated from micron-, submicron or nanoscale-electrodes 102, 104, depending on the application.

Although not explicitly shown in FIG. 2A, respective crests 112 may be provided at the respective junctions 106 of the first electrodes 102 and the second electrodes 104. An example of this configuration is depicted in greater detail with respect to FIG. 2B, which shows a cross-sectional front view of a portion of the crossbar array 200 depicted in FIG. 2A. It should be understood that the illustration depicted in FIG. 2B is generally consistent for the remaining relationships between the substrate 120, the first electrode 102, and the second electrode 104.

Figure 2B:
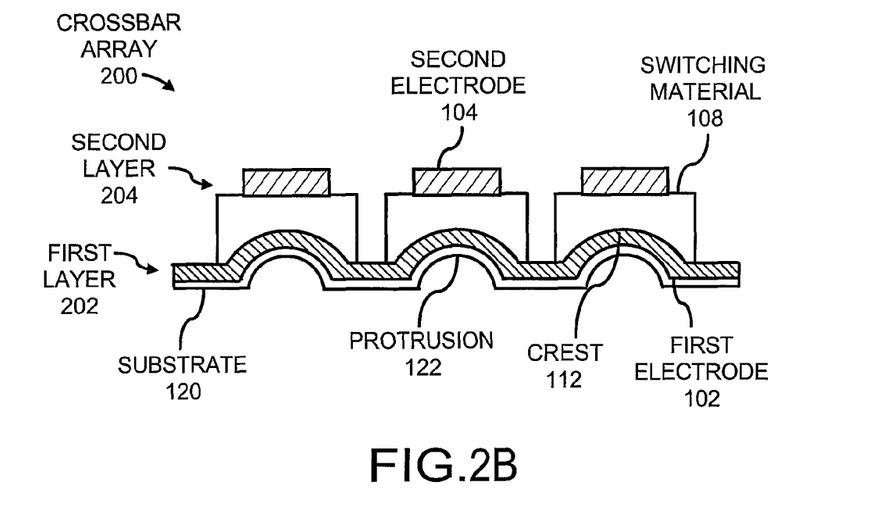
FIG. 2B illustrates a cross-sectional front view of a portion of the crossbar array depicted in FIG. 2A, according to an embodiment of the invention.

As shown in FIG. 2B, the substrate 120 includes a plurality of protrusions 122 that extend in a first direction toward the second electrode 104. The protrusions 122 are depicted as dimples in the substrate 120. In this embodiment, the protrusions 122 may be formed in the substrate 120 through use of a photoresist, in which dimples are formed, and then through a dry etch process, in which the protrusions 122 in the substrate 120 are replicated from the dimples in the photoresist. The protrusions 122 may, however, be formed through other suitable processes, such as, through placement of additional material to build up the protrusions 122 on the substrate 120.

In addition, although the protrusions 122 have been depicted as having relatively rounded configurations, the protrusions 122 may have other suitable configurations. Examples of other suitable configurations include, for instance, a cone shape, a pyramid shape, a triangular shape, etc. In addition, although the crests 112 have been depicted as having relatively rounded configurations, the crests 112 may also have other suitable configurations, such as, configurations that correspond in shape to those discussed above with respect to the protrusions 122.

As further shown in FIG. 2B, the first electrode 102 generally conforms to the shapes of the protrusions 122, such that the first electrode 102 includes a plurality of crests 112. In addition, respective portions of the switching material 108 are depicted as being positioned over the crests 112 and beneath the second electrodes 104.

The crossbar array 200 may include a plurality of memristors 100 having configurations that differ from the memristor 100 depicted in FIG. 1A. Examples of other suitable memristor 100 configurations within the scope of the present invention are described with respect to the following figures. It should be understand that the crossbar array 200 may employ any of the memristor 100 configurations depicted in FIGS. 1A and 3A-4B.

Figure 3A:
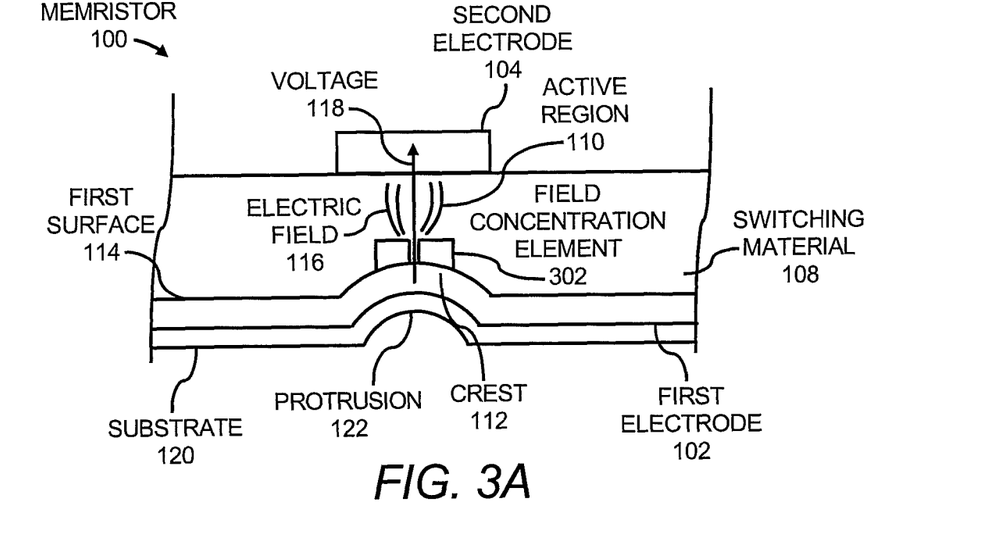
FIG. 3A illustrates a cross-sectional front view of a portion of the memristor depicted in FIG. 1A, according to another embodiment of the invention.

Turning first to FIG. 3A, there is shown a cross-sectional side view of the memristor 100 depicted in FIG. 1A, according to another example. As shown, the memristor 100 depicted in FIG. 3A includes all of the features of the memristor 100 depicted in FIG. 1A. In addition, the memristor 100 depicted in FIG. 3A also includes field concentration elements 302 provided in contact with the crest 112. The field concentration elements 302 are in electrical contact with the first electrode 102 and may comprise any of the materials discussed above with respect to the first electrode 102.

Figure 3B:
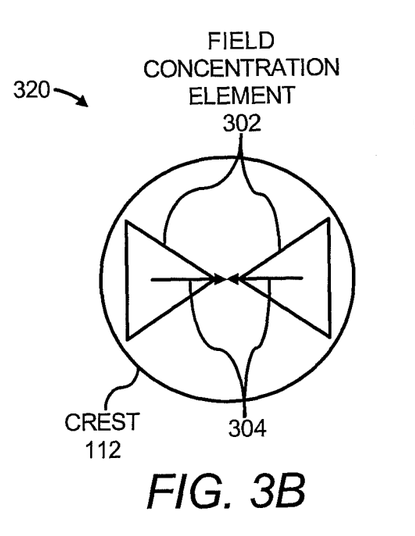
FIGS. 3B and 3C show respective top views of the field concentration elements depicted in FIG. 3A, according to two embodiments of the invention.
Figure 3C:
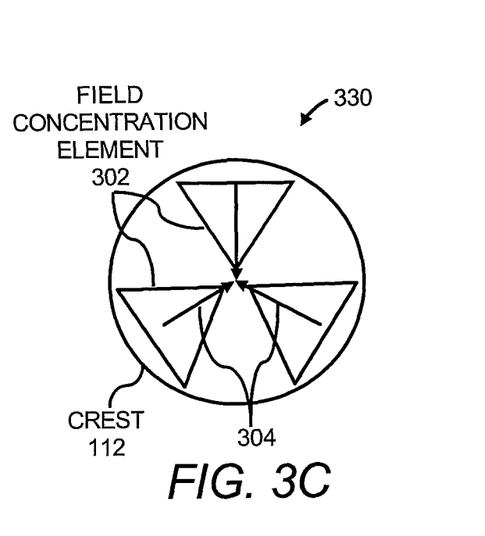

Turning now to FIGS. 3B and 3C, there are shown respective top views 320 of the field concentration elements 302 depicted in FIG. 3A, according to two embodiments. As shown in both FIGS. 3B and 3C, the field concentration elements 302 are depicted as having triangular shapes with tips that face a direction that is substantially perpendicular to the first direction, for instance the direction of the arrow depicted in FIG. 3A, and toward each other. FIG. 3B depicts two field concentration elements 302 and FIG. 3C depicts three field concentration elements 302. It should, however, be understood that any reasonably suitable number of field concentration elements 302 may be provided on the crest 112 (or on the first surface 114), without departing from a scope of the present invention.

Generally speaking, the field concentration elements 302 operate to further concentrate the electrical field 116 emitted from the crest 112 through the switching material 108 by focusing the electrical field toward a central location of the field concentration elements 302, as depicted by the arrows 304. According to an embodiment, the field concentration elements 302 may be placed or grown on the first electrode 102 prior to placement or growth of the switching material 108. According to another embodiment, the field concentration elements 302 may be attached to the first surface 114 of the first electrode 102 after the field concentration elements 302 have been formed.

As also shown in FIG. 3A, the field lines of the electric field 116 appear to be more focalized as compared with the field lines of the electric field 116 shown in the memristor 100 depicted in FIG. 1A. Thus, for instance, the field concentration elements 302 generally localize the formation of the conductive channel (active region 110) in the switching material 108 during the forming step.

As such, the electric field 116 at the tops of the field concentration elements 302 and the bottoms of the second electrode 104 is much higher than if the same bias was applied across the flat portions of the first surface 114 and a bottom surface of the second electrode 104. In addition to concentrating the electric field 116 during the electroforming step, the field concentration elements 302 will also localize the electrochemical reaction that occurs between the first electrode 102, the second electrode 104 and the switching material 108 and will also localize the mechanical stress during deposition of the switching material 108, all of which may assist in localizing the electroforming of the conductive channel in the switching material 108 at the desired location in the memristor 100.

Although not explicitly shown in FIG. 3A, field concentration elements 302 similar to the ones provided on the crest 112 may be provided on a bottom surface of the second electrode 104. In this embodiment, the field concentration elements 302 may be provided on the bottom surface of the second electrode 104 instead of the field concentration elements 302 provided on the first electrode 102. Alternatively, the field concentration elements 302 may be provided on both the second electrode 104 and the first electrode 102.

Figure 4A:
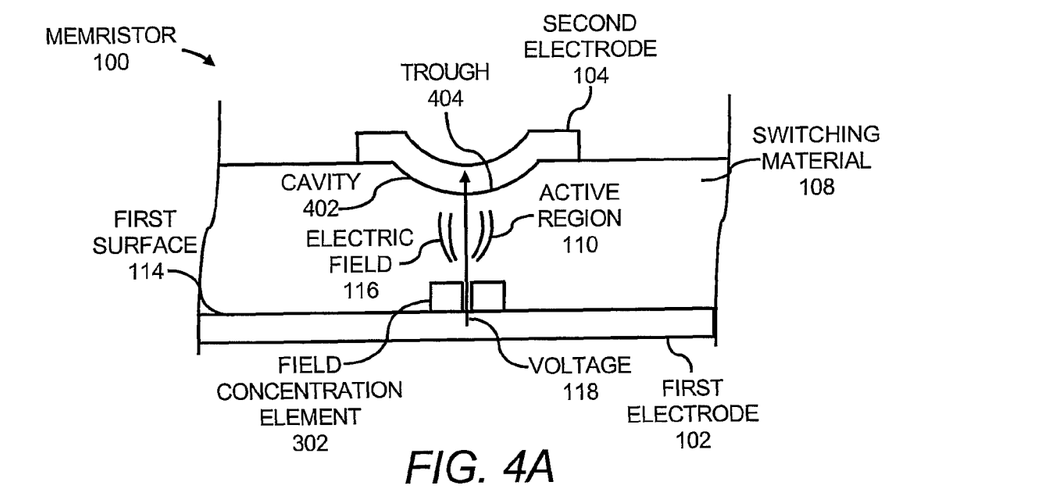
FIGS. 4A-4C, respectively, illustrate cross-sectional front views of a portion of the of the memristor depicted in FIG. 1A, according to other embodiments of the invention.

Turning now to FIG. 4A, there is shown a cross-sectional side view of the memristor 100 depicted in FIG. 1A, according to another example. As shown, the memristor 100 depicted in FIG. 4A includes all of the features of the memristor 100 depicted in FIG. 1A, except that the first electrode 102 does not include a crest 112. Instead, the second electrode 104 is depicted as having a trough 404 extending into a cavity 402 of the switching material 108.

In the memristor 100 depicted in FIG. 4A, the switching material 108 may be formed with a plurality of cavities 402 that extend in a first direction toward the first electrode 102. The cavities 402 may have the same or similar configurations as discussed above with respect to the protrusions 122 in the substrate 120. In addition, the cavities 402 may be spaced apart from each other similarly as discussed above with respect to the protrusions 122.

Also shown in FIG. 4A are a plurality of the field concentration elements 302 provided on the first surface 114 of the first electrode 102. Although the field concentration elements 302 have been depicted in FIG. 4A, it should be understood that the field concentration elements 302 are considered to be optional because the trough 404 on the second electrode 104 may enable a sufficient concentration of the electric field 116 to be maintained to create a conductive channel at a desired location in the switching material. If, however, the field concentration elements 302 are provided, the field concentration elements 302 may be arranged in any of the configurations depicted, for instance, FIGS. 3B and 3C.

Figure 4B:
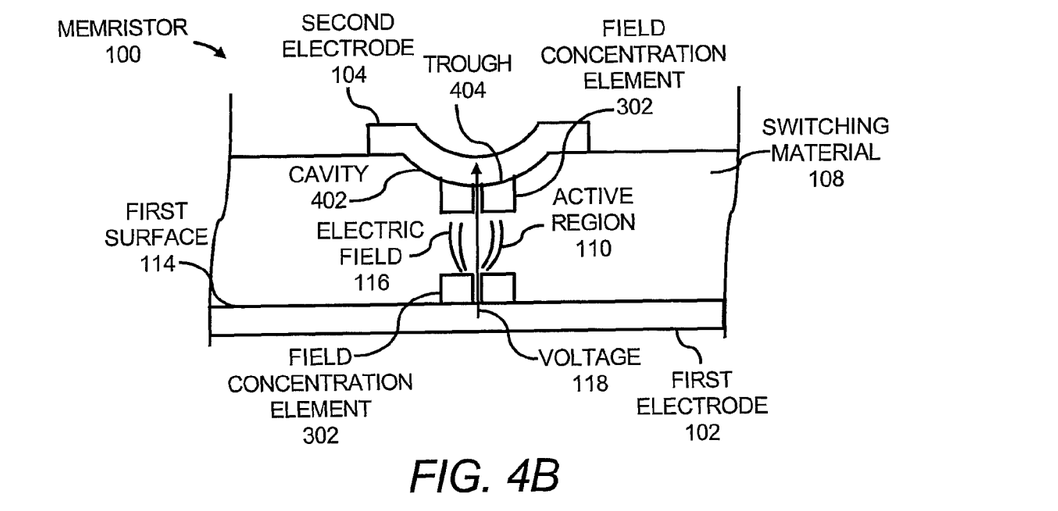

Turning now to FIG. 4B, there is shown a cross-sectional side view of the memristor 100 depicted in FIG. 4A, according to another example. As shown, the memristor 100 depicted in FIG. 4B includes all of the features of the memristor 100 depicted in FIG. 4A. In addition, the memristor 100 depicted in FIG. 4B includes field concentration elements 302 on the trough 404 of the second electrode 104. Similarly to FIG. 4A, the field concentration elements 302 may be arranged in any of the configurations depicted, for instance, in FIGS. 3B and 3C.

According to an embodiment, the field concentration elements 302 may be placed or grown on either or both of the first electrode 102 and the second electrode 104 prior to placement or growth of the switching material 108. According to another embodiment, the field concentration elements 302 may be attached to the first surface 114 of the first electrode 102 after the field concentration elements 302 have been formed. In either embodiment, the switching material 108 may be formed to include adequate spaces for the field concentration elements 302.

Figure 4C:
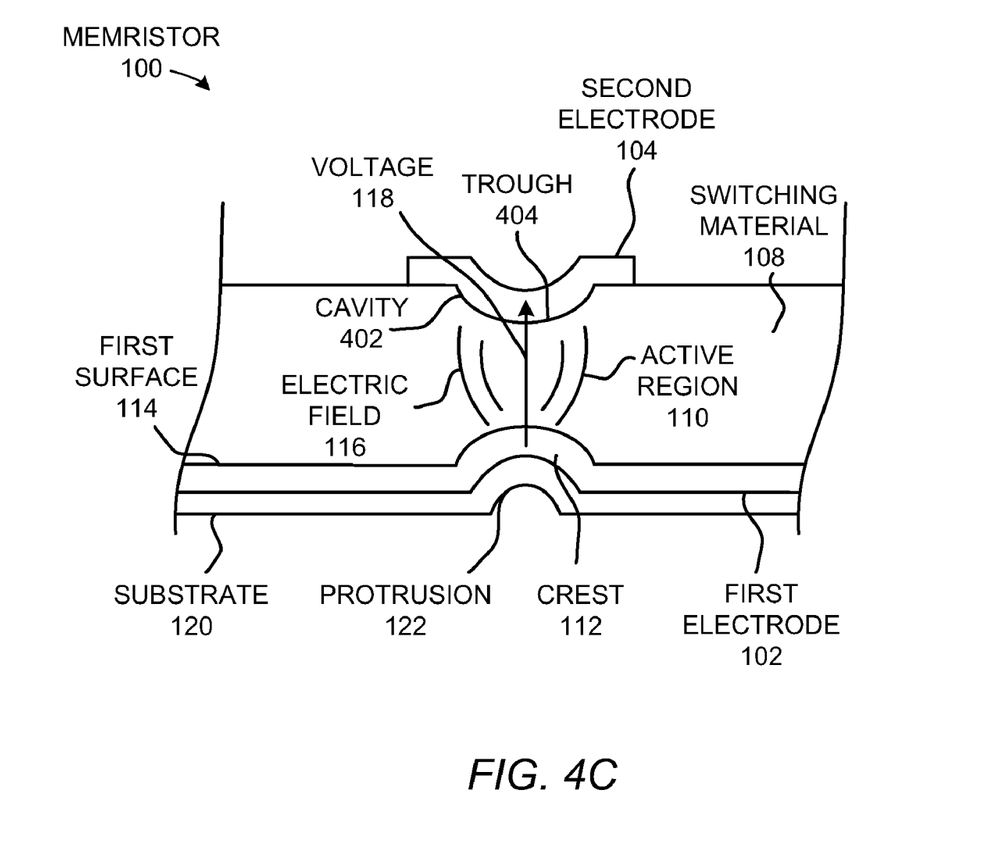

According to a further embodiment, and as shown in FIG. 4C, the first electrode 102 and the second electrode 104 may respectively include a crest 112 and a trough 404 facing toward each other. In this embodiment, the field concentration elements 302 may be omitted (as shown in FIG. 4C) or may be provided on either or both of the crest 112 and the trough 404. In addition, the switching material 108 may have a cavity 402 extending in a direction opposite the first direction in which the protrusion 122 in the substrate 120 extends. The cavity 402 may also be positioned substantially in line with the crest 112 of the first electrode 102, wherein the portion of the second electrode 102 that is substantially in line with the crest 112 of the first electrode 102 conforms to the shape of the cavity 402.

With regard to all of the previous figures, although the first electrodes 102 and second electrodes 104 are shown as having rectangular cross-sections, the first electrodes 102 and/or the second electrodes 104 may have other shaped cross-sections, for instance, circular, elliptical, or more complex cross-sections. The first electrodes 102 and/or the second electrodes 104 may also have many different widths or diameters and aspect ratios or eccentricities. The term "nanowire crossbar" may refer to crossbars having one or more layers of sub-microscale electrodes, microscale electrodes or electrodes with larger dimensions, in addition to nanowires.

Figure 5:
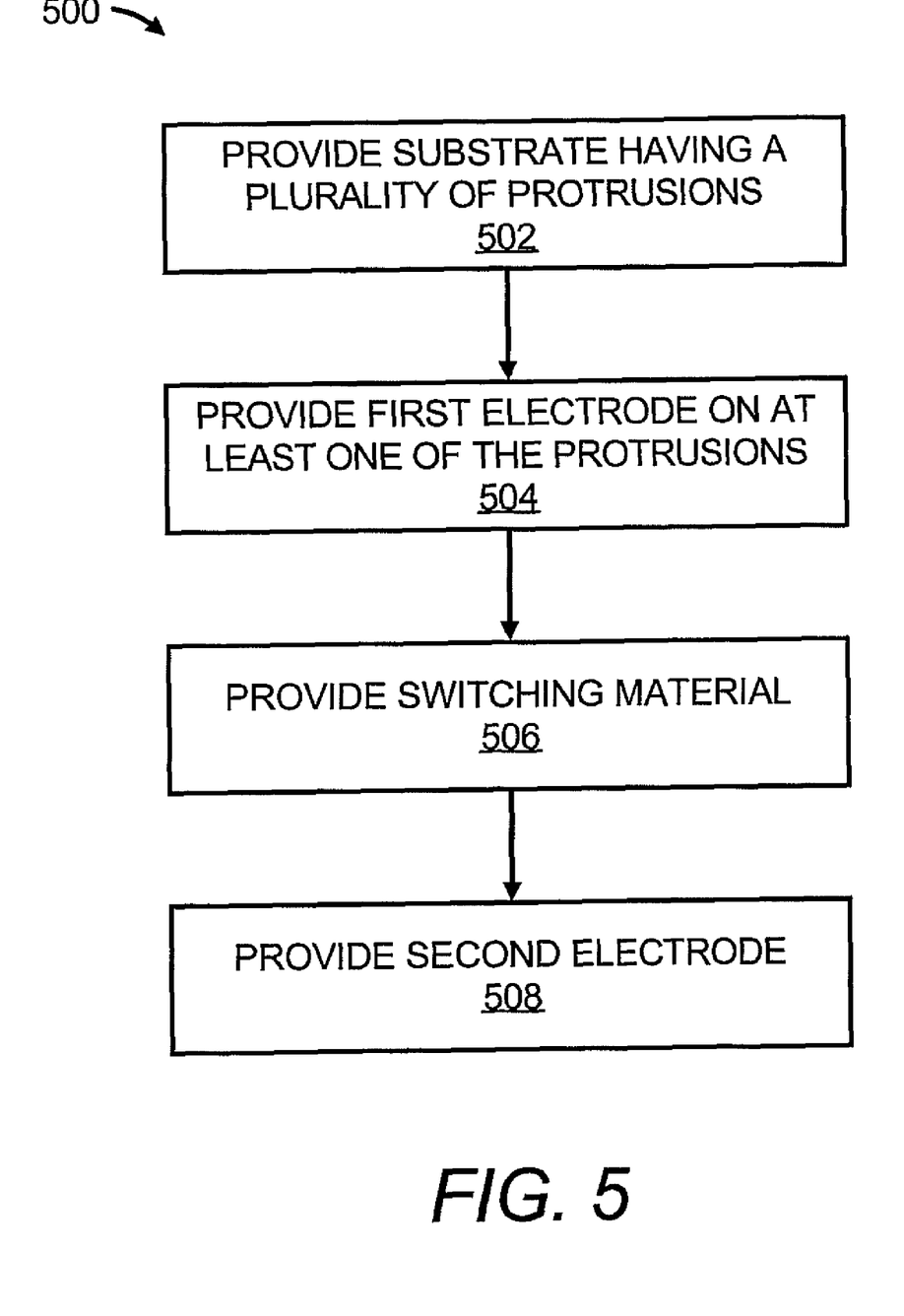
FIG. 5 illustrates a flow diagram of a method for fabricating a memristor, according to an embodiment of the invention.

Turning now to FIG. 5, there is shown a flow diagram of a method 500 for fabricating a memristor 100, according to an embodiment. It should be understood that the method 500 depicted in FIG. 5 may include additional steps and that some of the steps described herein may be removed and/or modified without departing from a scope of the method 500.

At step 502, a substrate 120 having a plurality of protrusions that extend in a first direction is provided.

At step 504, a first electrode 102 is provided on at least one of the plurality of protrusions 120, such that the first electrode 102 conforms to the shape of the at least one protrusion 120 and the first electrode 102 has a crest 112. The first electrode 102 may be provided through a formation process, such as, chemical vapor deposition, sputtering, etching, lithography, etc., which generally causes the crest 112 to be formed in the first electrode 102.

At step 506, a switching material 108 is provided upon the first surface 114, such that the switching material 108 covers the crest 112. According to an example, the switching material 108 is grown on the first surface 114 to cover the crest 112. The switching material 108 may be grown through use of, for instance, metal-catalyzed growth from vapor, liquid, or solid-phase precursors, growth from a chemical solution, or rapid deposition of material vaporized from a solid source. In addition, at step 506, a top surface of the switching material 108 may be planarized, for instance, by chemical-mechanical polishing to create a relative smooth surface. Moreover, for instance, as depicted in FIGS. 4A and 4B, the top surface of the switching material 108 may be processed to form cavities 402 into which a plurality of second electrodes 104 may be provided.

At step 508, a second electrode 104 is formed on the switching material 108 such that a portion of the second electrode 104 is substantially in line with the crest 112 of the first electrode 102 along the first direction. In addition, an active region in the switching material 108 is operable to be formed between the crest 112 of the first electrode 102 and the portion of the second electrode 104 that is substantially in line with the crest 112 of the first electrode 102.

In any regard, the second electrode 104 may be provided through a formation process, such as, chemical vapor deposition, sputtering, atomic layer deposition, etching, (imprint) lithography, etc. In embodiments where the switching material 108 includes one or more of the cavities 402, the second electrode 104 may be deposited into the one or more of the cavities 402, for instance, as depicted in FIGS. 4A and 4B. In addition, according to an embodiment, sections of the switching material 108 outside of the junctions 106 may be removed through an etching process.

In addition, one or both of the first electrode 102 and the second electrode 104 may be provided with field concentration elements 302, as discussed above with respect to FIGS. 3A-4B.

It should be understood that the memristors 100 depicted in the figures discussed above may be modified in various respects without departing from a scope of those disclosed memristors 100. By way of example, the switching material 108 may be composed of a dual layer structure as described in greater detail in the 20080090337 U.S. Patent Application Publication. As disclosed therein, the dual layer structure of the switching material enhances the switching properties and operation of devices using electrically actuated switches constructed therewith. That application for patent also describes a wide combination of materials than can be used to facilitate the switching process using the dual layer structure.

In one embodiment disclosed in that application for patent, the switching material comprises a thin titanium layer formed over a molecule having a switchable segment or moiety that is relatively energetically stable in two different states. The switchable molecule and the thin titanium layer form the switch junction connecting the electrodes.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A memristor comprising:
   a substrate having a plurality of protrusions, wherein each of the plurality of protrusions extends in a first direction;
   a first electrode provided over at least one of the plurality of protrusions, wherein the first electrode conforms to the shape of the at least one protrusion such that the first electrode has a crest, wherein the crest has a substantially rounded peak;
   a switching material positioned upon the first electrode;
   a second electrode positioned upon said switching material such that a portion of the second electrode is substantially in line with the crest of the first electrode along the first direction, wherein an active region in the switching material is to be formed between the crest of the first electrode and the portion of the second electrode that is substantially in line with the crest of the first electrode; and
   a plurality of field concentration elements positioned between the first electrode and the second electrode, each of said plurality of field concentration elements having a tip that faces a direction that is substantially perpendicular to the first direction and toward each other.

2. The memristor of claim 1, wherein the plurality of protrusions are spaced apart from each other in a second direction that is substantially perpendicular to the first direction, wherein the plurality of protrusions are spaced apart from each other with a sufficient distance to substantially prevent cross talk between adjacent first electrodes.

3. The memristor of claim 1, wherein the switching material comprises a cavity extending in a direction opposite the first direction and positioned substantially in line with the crest of the first electrode, wherein the portion of the second electrode that is substantially in line with the crest of the first electrode conforms to the shape of the cavity.

4. The memristor of claim 3,
   wherein the plurality of field concentration elements are provided on the portion of the second electrode that conforms to the shape of the cavity.

5. The memristor of claim 1,
   wherein the plurality of field concentration elements are provided on at least one of the crest of the first electrode and on the portion of the second electrode that is substantially in line with the crest of the first electrode.

6. The memristor of claim 5, wherein the plurality of field concentration elements are integrally formed with the at least one of the first electrode and the second electrode.

7. The memristor of claim 5, wherein the plurality of field concentration elements comprise separately formed elements from the at least one of the first electrode and the second electrode.

8. A memristor comprising:
   a first electrode;
   a switching material having a first surface and a second surface opposite the first surface, said first surface contacting the first electrode, said second surface comprising a cavity extending in a first direction toward the first electrode;
   a second electrode positioned upon the second surface of the switching material such that a portion of the second electrode is substantially in line with a section of the first electrode along the first direction, wherein the portion of the second electrode that is substantially in line with the section of the first electrode conforms to the shape of the cavity, such that the second electrode has a trough having a substantially rounded bottom, and wherein an active region in the switching material is to be formed between the section of the first electrode and the trough of the second electrode; and
   a plurality of field concentration elements positioned between the first electrode and the second electrode, each of said plurality of field concentration elements having a tip that faces a direction that is substantially perpendicular to the first direction and toward each other.

9. The memristor of claim 8,
   wherein the plurality of field concentration elements are provided on at least one of the trough of the second electrode and a surface of the first electrode facing the second electrode.

10. The memristor of claim 9, wherein the plurality of field concentration elements are integrally formed with the at least one of the first electrode and the second electrode.

11. The memristor of claim 9, wherein the plurality of field concentration elements comprise separately formed elements from the at least one of the first electrode and the second electrode.

12. A crossbar array composed of a plurality of memristors, said crossbar array comprising:
a substrate having a plurality of protrusions, wherein each of the plurality of protrusions extend in a first direction;
a plurality of first electrodes approximately parallel with respect to each other, each of the plurality of first electrodes positioned over at least one of the plurality of protrusions and conforming to the shape of the at least one protrusion such that each of the plurality of first electrodes has a crest, wherein the crest has a substantially rounded peak;
a switching material positioned upon the crests of the plurality of first electrodes; and
a plurality of second electrodes positioned approximately parallel with respect to each other and approximately perpendicularly with respect to the plurality of first electrodes upon said switching material such that a portion of each of the second electrodes is substantially in line with the crests of the plurality of the first electrodes along the first direction, wherein respective active regions in the switching material are to be formed between the crests of the first electrodes and the portions of the second electrodes that are substantially in line with respective ones of the crests of the first electrodes; and
a plurality of field concentration elements positioned between the plurality of first electrodes and the plurality of second electrodes, each of said plurality of field concentration elements having a tip that faces a direction that is substantially perpendicular to the first direction and toward each other.

13. The crossbar array of claim 12, wherein the plurality of protrusions are spaced apart from each other in a second direction that is substantially perpendicular to the first direction, wherein each of the plurality of first electrodes extends across multiple ones of the plurality of protrusions and wherein the plurality of protrusions are spaced apart from each other with a sufficient distance to substantially prevent cross talk between adjacent active regions in the switching material.

14. The crossbar array of claim 12, wherein the plurality of protrusions comprise a plurality of dimples formed in the substrate.

15. The crossbar array of claim 12, wherein the switching material comprises a plurality of cavities, each of said plurality of cavities extending in a direction opposite the first direction and positioned substantially in line with the crest of at least one respective first electrode, wherein the portions of the second electrodes that are substantially in line with the crests of respective first electrodes conforms to the shape of the cavity.

16. The crossbar array of claim 12,
wherein the plurality of field concentration elements are provided on the crests of the plurality of first electrodes.

17. The crossbar array of claim 12,
wherein the plurality of field concentration elements are provided on the portions of the plurality of second electrodes that are substantially in line with the crests of respective ones of the plurality of first electrodes.

18. A method for fabricating a memristor, said method comprising:
providing a substrate having a plurality of protrusions, wherein each of the plurality of protrusions extends in a first direction;
providing a first electrode on at least one of the plurality of protrusions, wherein the first electrode conforms to the shape of the at least one protrusion such that the first electrode has a crest, wherein the crest has a substantially rounded peak;
providing a switching material upon the first electrode;
providing a second electrode upon said switching material such that a portion of the second electrode is substantially in line with the crest of the first electrode along the first direction, wherein an active region in the switching material is to be formed between the crest of the first electrode and the portion of the second electrode that is substantially in line with the crest of the first electrode; and
providing a plurality of field concentration elements between the plurality of first electrodes and the plurality of second electrodes, each of said plurality of field concentration elements having a tip that faces a direction that is substantially perpendicular to the first direction and toward each other.

19. The method according to claim 18, wherein providing the switching material further comprises forming a cavity extending in a direction opposite the first direction and positioned substantially in line with the crest of the first electrode, and wherein providing the second electrode further comprises providing the second electrode to cause the portion of the second electrode that is substantially in line with the crest of the first electrode to conform to the shape of the cavity.

20. The method according to claim 18, further comprising:
wherein providing the plurality of field concentration elements further comprises providing the plurality of field concentration elements on at least one of the crest of the first electrode and on the portion of the second electrode that is substantially in line with the crest of the first electrode.

* * * * *